US009506158B2

(12) United States Patent
Rohde et al.

(10) Patent No.: US 9,506,158 B2
(45) Date of Patent: Nov. 29, 2016

(54) METHOD FOR COPPER PLATING

(75) Inventors: Dirk Rohde, Berlin (DE); Bernd Roelfs, Berlin (DE); Jun Higuchi, Kanagawa (JP)

(73) Assignee: Atotech Deutschland GmbH, Berlin (DE)

( * ) Notice: Subject to any disclaimer, the term of this patent is extended or adjusted under 35 U.S.C. 154(b) by 275 days.

(21) Appl. No.: 14/124,268

(22) PCT Filed: May 7, 2012

(86) PCT No.: PCT/EP2012/058377
§ 371 (c)(1),
(2), (4) Date: Dec. 6, 2013

(87) PCT Pub. No.: WO2012/175249
PCT Pub. Date: Dec. 27, 2012

(65) Prior Publication Data
US 2014/0102910 A1 Apr. 17, 2014

(30) Foreign Application Priority Data

Jun. 22, 2011 (EP) .................................. 11171055

(51) Int. Cl.
| | |
|---|---|
| *C25D 3/38* | (2006.01) |
| *C25D 7/12* | (2006.01) |
| *C25D 5/34* | (2006.01) |
| *H01L 21/288* | (2006.01) |
| *H05K 3/42* | (2006.01) |
| *H01L 21/768* | (2006.01) |
| *H05K 3/18* | (2006.01) |

(52) U.S. Cl.
CPC . *C25D 3/38* (2013.01); *C25D 5/34* (2013.01); *C25D 7/123* (2013.01); *H01L 21/2885* (2013.01); *H01L 21/76898* (2013.01); *H05K 3/423* (2013.01); *H05K 3/187* (2013.01); *H05K 2203/0733* (2013.01)

(58) Field of Classification Search
CPC ................................. C25D 3/38; H05K 3/188
USPC .................................................. 205/297, 298
See application file for complete search history.

(56) References Cited

U.S. PATENT DOCUMENTS

| | | |
|---|---|---|
| 3,542,655 A | 11/1970 | Kardos |
| 5,041,551 A | 8/1991 | Findeisen et al. |
| 2004/0187731 A1 | 9/2004 | Wang et al. |

(Continued)

FOREIGN PATENT DOCUMENTS

| | | |
|---|---|---|
| CN | 1497069 | 5/2004 |
| CN | 101481812 | 7/2009 |

(Continued)

OTHER PUBLICATIONS

Official Action for corresponding Chinese Application No. 201280030816.8 dated Aug. 26, 2015 and it English translation.

(Continued)

*Primary Examiner* — Edna Wong
(74) *Attorney, Agent, or Firm* — Renner, Otto, Boisselle & Sklar, LLP

(57) ABSTRACT

A method for copper plating in a plating bath wherein the substrate is brought into contact with a leveller additive comprising a heterocyclic core having a thiol group and an amino group attached to the heterocyclic core by a spacer is disclosed. The method is particularly suitable for filling recessed structures in the manufacture of printed circuit boards, IC substrates and semiconducting substrates.

20 Claims, 7 Drawing Sheets

(56) References Cited

U.S. PATENT DOCUMENTS

| | | |
|---|---|---|
| 2006/0189141 A1 | 8/2006 | Mahlkow et al. |
| 2009/0038949 A1 | 2/2009 | Hayashi et al. |
| 2009/0188807 A1* | 7/2009 | Egli .................. C25D 3/60 205/241 |
| 2011/0147220 A1* | 6/2011 | Zhang-Beglinger ..... C25D 3/62 205/122 |

FOREIGN PATENT DOCUMENTS

| | | | |
|---|---|---|---|
| CN | 101824621 | 9/2010 | |
| CN | 102277567 | 12/2011 | |
| DE | WO 2009109391 A1 * | 9/2009 | ............. C23C 22/52 |
| EP | 1069211 | 1/2001 | |
| TW | 200940751 | 10/2009 | |
| WO | WO 2009109391 A1 * | 9/2009 | ............. C23C 22/52 |

OTHER PUBLICATIONS

PCT/EP2012/058377; PCT International Search Report and Written Opinion of the International Searching Authority dated Sep. 28, 2012.

Search Report for corresponding Taiwanese Application No. 101121412 dated Jan. 26, 2016 and its English translation.

* cited by examiner

METHOD FOR COPPER PLATING

The present application is a U.S. National Stage Application based on and claiming benefit and priority under 35 U.S.C. §371 of International Application No. PCT/EP2012/058377, filed 7 May 2012, which in turn claims benefit of and priority to European Application No. 11171055.4, filed 22 Jun. 2011, the entirety of each of which is hereby incorporated herein by reference.

FIELD OF THE INVENTION

This invention relates to the field of electroplating of copper onto substrates. In particular to aqueous acidic copper plating bath compositions, pre-treatment compositions for copper plating and their applications.

BACKGROUND OF THE INVENTION

Pre-treatment compositions for copper plating and aqueous acidic plating baths for electrolytic deposition of copper are used for manufacturing printed circuit boards and IC substrates where fine structures like trenches, through holes (TH), blind micro vias (BMV) and pillar bumps need to be filled or build up with copper. Another application of such electrolytic deposition of copper is filling of recessed structures such as through silicon vias (TSV) or forming redistribution layers (RDL) and pillar bumps in and on semiconducting substrates.

Organic leveller additives present in a pre-treatment composition and/or in an acidic copper plating bath are adsorbed onto the substrate surface and influence the copper deposition thereon.

The patent application EP 1 249 861 A2 discloses a pre-treatment composition for copper deposition onto semiconducting substrates. The pre-treatment composition comprises an organic sulfide or disulfide additive and optionally a leveller additive such as phenazine azo dyes.

The patent application JP 2001-152387 A discloses a process for copper plating wherein the substrate is (i) immersed in a pre-treatment composition containing an additive which is selected from the group of chloride ions, surfactants and nitrogen-containing organic compounds, (ii) rinsed and (iii) copper deposited from a plating bath which is free of surfactants.

The patent document U.S. Pat. No. 2,758,076 discloses an acidic copper plating bath comprising 5-amino-2-mercaptobenzimidazole. Copper deposits derived from such a plating bath are very bright, fine-grained, soft and good leveled.

The patent application EP 1 069 211 A2 discloses an acidic copper plating bath which comprises a low molecular leveller additive selected from N-containing five membered and N-containing six membered heterocyclic molecules such as 5-phenyl-1H-1,2,4-triazole-3-thiol and 4-amino-5-(4'-pyridyl)-4H-1,2,4-triazole-3-thiol.

However, such leveller additives in a pre-treatment composition and/or in acidic copper plating baths are not suitable to fulfill the current and future requirements in manufacture of advanced printed circuit boards, IC substrates and metallization of semiconducting substrates. BMVs in printed circuit boards and IC substrates need to be filled with copper completely and not only conformally. Typical requirements for BMV filling are for example: obtaining a completely filled BMV while depositing no more than 10 to 15 μm of copper onto the neighbouring planar substrate areas and at the same time creating a dimple on the outer surface of the filled BMV of no more than 0 to 5 μm.

In metallization of semiconducting wafers, TSV filling must lead to a complete and void-free filling with copper while creating no more than ⅕ of via diameter of overplated copper onto the neighbouring planar areas.

During use of an acidic copper plating bath leveller additives tend to form break-down products which reduce the life time of such plating baths.

Furthermore, inclusion of leveller additives or of break-down products thereof into the copper deposit during copper deposition has a negative impact on mechanical properties such as ductility of the deposited copper.

Utilization of leveller additives in pre-treatment compositions still does not solve such problems. Especially the levelling and TSV filling properties of such leveller additives used in pre-treatment compositions is not sufficient to meet the requirements in state of the art manufacture of printed circuit boards, IC substrates and semiconductor metallisation.

OBJECTIVE OF THE PRESENT INVENTION

Thus, it is an objective of the present invention to provide a pre-treatment composition and/or an aqueous copper acidic plating bath for electrolytic deposition of copper which fulfills the requirements for the above mentioned applications in the field of printed circuit board and IC substrate manufacturing as well as metallization of semiconducting substrates like TSV filling, deposition of redistribution layers or pillar bumping.

SUMMARY OF THE INVENTION

This objective is solved by a method for copper plating in a plating bath wherein the substrate is brought into contact with a leveller additive prior and/or during copper plating and wherein the leveller additive is selected from molecules according to formula (I):

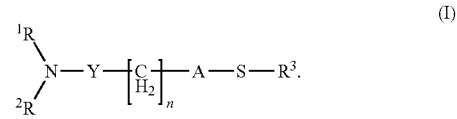

Y is selected from the group consisting of —(NR4)—, —(CH2)—, —O— and —S— and n ranges from 0 to 6.

$R^1$ and $R^2$ are independently selected from hydrogen and $C_1$ to $C_4$ alkyl, linear and branched. Preferably $R^1$ and $R^2$ are selected from the group consisting of hydrogen, methyl and ethyl. Most preferably $R^1$ and $R^2$ are the same and selected from the group consisting of hydrogen, methyl and ethyl.

$R^3$ is selected from hydrogen, $C_1$ to $C_4$ alkyl, linear and branched, lithium, sodium, potassium and ammonium.

The heterocyclic moiety A is selected from unsubstituted triazole and unsubstituted tetraazole.

$R^4$ is selected from the group consisting of hydrogen and $C_1$ to $C_4$ alkyl, linear and branched.

Organic leveller additives according to formula (I) present in the aqueous pre-treatment composition and/or in the acidic copper plating bath are adsorbed onto the substrate surface and influence the copper deposition thereon.

DETAILED DESCRIPTION OF THE INVENTION

Figure 1:
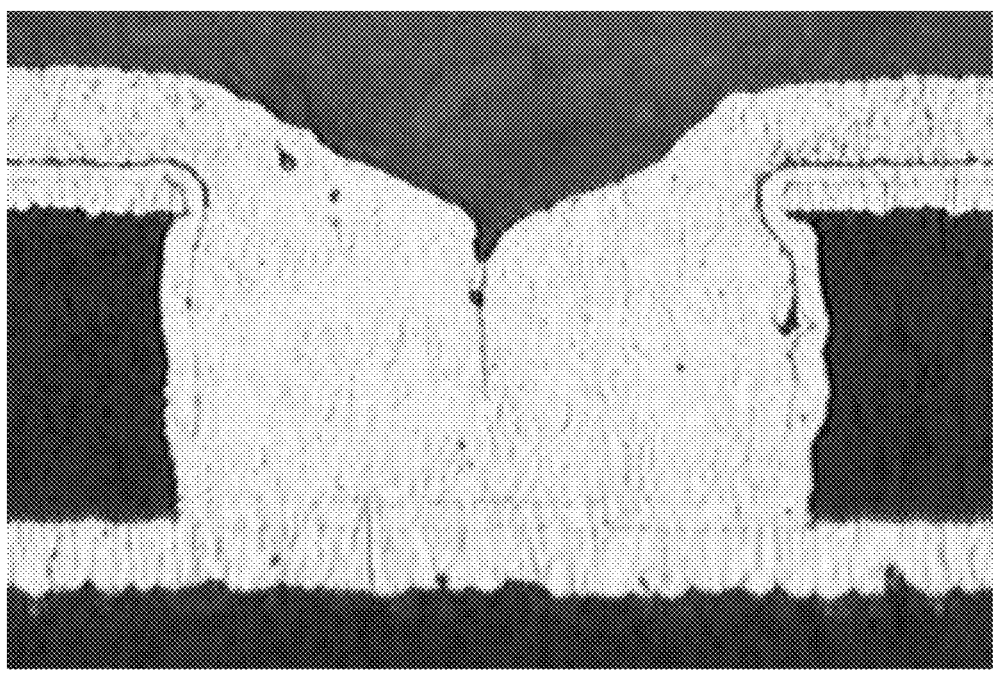
FIG. 1 shows an optical micrograph of a filled BMV obtained from Example 1 (comparative).

The leveller additive according to the present invention is selected from molecules according to formula (I):

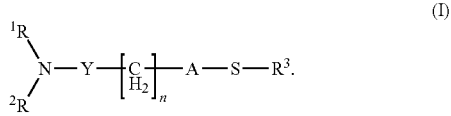
(I)

Y is selected from the group consisting of —(NR$^4$)—, —(CH$_2$)—, —O— and —S—, n ranges from 0 to 6 and A is an unsubstituted heterocyclic moiety.

In case Y is selected from —(NR$^4$)—, —O— and —S—, n ranges preferably from 1 to 6.

R$^1$ and R$^2$ are independently selected from hydrogen and C$_1$ to C$_4$ alkyl, linear and branched. Preferably R$^1$ and R$^2$ are selected from the group consisting of hydrogen, methyl and ethyl. Most preferably R$^1$ and R$^2$ are the same and selected from the group consisting of hydrogen, methyl and ethyl.

R$^3$ is selected from hydrogen, C$_1$ to C$_4$ alkyl, linear and branched, lithium, sodium, potassium and ammonium.

R$^4$ is selected from the group consisting of hydrogen and C$_1$ to C$_4$ alkyl, linear and branched.

The heterocyclic moiety A is selected from unsubstituted triazole and unsubstituted tetrazole.

The term 'unsubstituted' is defined herein as having no more and no other substituents than hydrogen, one

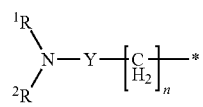

moiety and one —SR$^3$ moiety attached to the heterocyclic moiety A.

The —SR$^3$ and

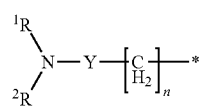

moieties can independently either be bonded to a carbon or a nitrogen atom of the heterocyclic moiety A.

More preferably the —SR$^3$ moiety is bonded to a carbon atom of the heterocyclic moiety A.

In one embodiment of the present invention, n ranges from 1 to 6 if Y is selected from —(NR$^4$)—, —O— and —S—.

In a preferred embodiment of the present invention Y is selected from the group consisting of —(CH$_2$)— and —(NR$^4$)—, n ranges from 1 to 3 and R$^4$ is selected from hydrogen, methyl and ethyl.

In one embodiment of the present invention the substrate is brought into contact with an aqueous pre-treatment composition comprising the leveller additive according to formula (I).

The concentration of the at least one leveller additive according to formula (I) in the aqueous pre-treatment composition ranges from 0.001 mg/l to 100 mg/l, more preferably from 0.005 mg/l to about 10 mg/l and most preferably from 0.01 mg/ to 1 mg/l.

The aqueous pre-treatment composition further comprises at least one acid.

The aqueous pre-treatment composition has a pH value of ≤2, more preferably of ≤1.

The at least one source of acid is selected from the group comprising sulfuric acid, fluoro boric acid, phosphoric acid and methane sulfonic acid and is added in a concentration of 20 g/l to 400 g/l, more preferably from 50 g/l to 300 g/l.

The aqueous pre-treatment composition preferably further contains at least one accelerator-brightener additive. The at least one accelerator-brightener additive is selected from the group comprising organic thiol-, sulfide-, disulfide- and poly-sulfide-compounds. Preferred accelerator-brightener additives are selected from the group comprising 3-(benzthiazolyl-2-thio)-propylsulfonic-acid, 3-mercapto-propan-1-sulfonic-acid, ethylendithiodipropylsulfonic-acid, bis-(p-sulfophenyl)-disulfide, bis-(ω-sulfobutyl)-disulfide, bis-(ω-sulfohydroxypropyl)-disulfide, bis-(ω-sulfopropyl)-disulfide, bis-(ω-sulfopropyl)-sulfide, methyl-(ω-sulfopropyl)-disulfide, methyl-(ω-sulfopropyl)-trisulfide, O-ethyl-dithiocarbonic-acid-S-(ω-sulfopropyl)-ester, thioglycol-acid, thiophosphoric-acid-O-ethyl-bis-(ω-sulfopropyl)-ester, thiophosphoric-acid-tris-(ω-sulfopropyl)-ester and their corresponding salts. The concentration of all accelerator-brightener additives present in the aqueous pre-treatment composition ranges from 0.01 mg/l to 100 mg/l, more preferably from 0.05 mg/l to 10 mg/l.

Optionally, the aqueous pre-treatment composition contains in addition to the at least one leveller additive according to formula (I) at least one further leveller additive selected from the group comprising nitrogen containing organic compounds such as polyethyleneimine, alkoxylated polyethyleneimine, alkoxylated caprolactames and polymers thereof, diethylenetriamine and hexamethylene-tetramine, organic dyes such as Janus Green B, Bismarck Brown Y and Acid Violet 7, sulfur containing amino acids such as cysteine, phenazinium salts and derivatives thereof. The preferred optional further leveller additive is selected from nitrogen containing organic compounds. Said optional leveller additive compounds are added to the aqueous pre-treatment composition in amounts of 0.1 mg/l to 100 mg/l.

The aqueous pre-treatment composition may further contains at least one carrier-suppressor additive. The at least one optional carrier-suppressor additive is usually a polyalkylenglycol compound and is selected from the group comprising polyvinylalcohol, carboxymethylcellulose, polyethylenglycol, polypropylenglycol, stearic acid polyglycolester, alkoxylated naphtoles, oleic acid polyglycolester, stearylalcoholpolyglycolether, nonylphenolpolyglycolether, octanolpolyalkylenglycolether, octanediol-bis-(polyalkylenglycolether), poly(ethylenglycol-ranpropylenglycol), poly(ethylenglycol)-block-poly(propylenglycol)-block-poly(ethylenglycol), poly(propylenglycol)-block-poly(ethylenglycol)-block-poly(propylenglycol). The concentration of said optional carrier-suppressor additives in the aqueous pre-treatment composition ranges from 0.005 g/l to 20 g/l, more preferably from 0.01 g/l to 5 g/l.

The aqueous pre-treatment composition may further contains at least one source of halogenide ions, preferably chloride ions in a quantity of 20 mg/l to 200 mg/l, more preferably from 30 mg/l to 60 mg/l.

The aqueous pre-treatment composition may further contains at least one wetting agent which can be a cationic, anionic or non ionic surfactant. Non ionic surfactants are preferred. Applicable wetting agents and their concentration are known from prior art.

The substrate is contacted with the aqueous pre-treatment composition for 1 min to 25 min, more preferably for 3 min to 15 min. During contact the temperature of the aqueous pre-treatment composition is held in a range of 15° C. to 80° C., more preferably 20° C. to 60° C.

The substrate can be contacted with the aqueous pre-treatment composition for example by spraying or dipping. The methods described herein may be performed in a conventional dip-tank technique (vertical processing) or in a conveyorised machine (horizontal processing). For semiconductor substrates the pre-treatment of the substrate to be plated can be performed in vacuum.

Next, the substrate is rinsed with water and contacted with an aqueous acidic copper plating bath. The kind of acidic copper plating bath is not restricted to certain types of acidic copper plating baths. An electrical current is applied to the substrate for plating purpose.

Preferably, the aqueous acidic copper plating bath does not contain a leveller additive according to formula (I). Copper plating baths and process parameters for electrolytic deposition of copper are known in the art and can be applied and adapted to the process according to the present invention by a person skilled in the art.

In another embodiment of the present invention the substrate is brought into contact with an aqueous acidic copper plating bath composition comprising a leveller additive according to formula (I).

The concentration of the at least one leveller additive according to formula (I) in the aqueous acidic copper plating bath ranges from 0.001 mg/l to 100 mg/l, more preferably from 0.005 mg/l to about 10 mg/l and most preferably from 0.01 mg/ to 1 mg/l.

The aqueous acidic copper plating bath composition has a pH value of ≤2, more preferably of ≤1.

The aqueous acidic copper plating bath further contains at least one source of copper ions which is preferably selected from the group comprising copper sulfate and copper alkyl sulfonates such as copper methane sulfonate. The copper ion concentration usually ranges from 15 g/l to 75 g/l.

The aqueous acidic copper plating bath further contains at least one source of acid which is preferably selected from the group comprising sulfuric acid, fluoro boric acid, phosphoric acid and methane sulfonic acid and is usually added in a concentration of 20 g/l to 400 g/l, more preferably from 50 g/l to 300 g/l.

Optionally, the aqueous acidic copper plating bath contains in addition to the at least one leveller additive according to formula (I) at least one further leveller additive selected from the group comprising nitrogen containing organic compounds such as polyethyleneimine, alkoxylated polyethyleneimine, alkoxylated caprolactames and polymers thereof, diethylenetriamine and hexamethylene-tetramine, organic dyes such as Janus Green B, Bismarck Brown Y and Acid Violet 7, sulphur containing amino acids such as cysteine, phenazinium salts and derivatives thereof. The preferred further leveller additive is selected from nitrogen containing organic compounds. Said optional leveller additive compounds are added to the aqueous acidic copper plating bath in amounts of 0.1 mg/l to 100 mg/l.

The aqueous acidic copper plating bath may further contains at least one accelerator-brightener additive which is selected from the group comprising organic thiol-, sulfide-, disulfide- and polysulfide-compounds. Preferred accelerator-brightener additives are selected from the group comprising 3-(benzthiazolyl-2-thio)-propylsulfonic-acid, 3-mercaptopropan-1-sulfonic-acid, ethylendithiodipropylsulfonic-acid, bis-(p-sulfophenyl)-disulfide, bis-(ω-sulfobutyl)-disulfide, bis-(ω-sulfohydroxypropyl)-disulfide, bis-(ω-sulfopropyl)-disulfide, bis-(ω-sulfopropyl)-sulfide, methyl-(ω-sulfopropyl)-disulfide, methyl-(ω-sulfopropyl)-trisulfide, O-ethyl-dithiocarbonic-acid-S-(ω-sulfopropyl)-ester, thioglycol-acid, thiophosphoric-acid-O-ethyl-bis-(ω-sulfopropyl)-ester, thiophosphoric-acid-tris-(ω-sulfopropyl)-ester and their corresponding salts. The concentration of all accelerator-brightener additives optionally present in the aqueous acidic copper bath compositions ranges from 0.01 mg/l to 100 mg/l, more preferably from 0.05 mg/l to 10 mg/l.

The aqueous acidic copper plating bath may further contains at least one carrier-suppressor additive which is usually a polyalkylenglycol compound and is selected from the group comprising polyvinylalcohol, carboxymethylcellulose, polyethylenglycol, polypropylenglycol, stearic acid polyglycolester, alkoxylated naphtoles, oleic acid polyglycolester, stearylalcoholpolyglycolether, nonylphenolpolyglycolether, octanolpolyalkylenglycolether, octanediol-bis-(polyalkylenglycolether), poly(ethylenglycol-ran-propylenglycol), poly(ethylenglycol)-block-poly(propylenglycol)-block-poly(ethylenglycol), poly(propylenglycol)-block-poly(ethylenglycol)-block-poly(propylenglycol). The concentration of said carrier-suppressor additives ranges from 0.005 g/l to 20 g/l, more preferably from 0.01 g/l to 5 g/l.

The aqueous acidic copper plating bath optionally further contains at least one source of halogenide ions, preferably chloride ions in a quantity of 20 mg/l to 200 mg/l, more preferably from 30 mg/l to 60 mg/l.

The aqueous acidic copper plating bath is operated in the method according to the present invention at a temperature range of 15° C. to 50° C., more preferably in a range of 25° C. to 40° C. by applying an electrical current to the substrate. A cathodic current density range of 0.01 A/dm$^2$ to 12 A/dm$^2$, more preferably 0.1 A/dm$^2$ to 7 A/dm$^2$ is applied.

In still another embodiment of the present invention the substrate to be coated with copper from the aqueous acidic copper plating bath is immersed in an aqueous pre-treatment composition prior to immersion into the acidic copper plating bath. Said aqueous pre-treatment composition comprises at least one leveller additive according to formula (I) and wherein said aqueous pre-treatment composition does not contain copper ions. Optionally, the substrate is rinsed with water after immersing in said aqueous pre-treatment composition.

EXAMPLES

The invention will now be illustrated by reference to the following non-limiting examples.

A sufficient BMV filling with copper means that the copper deposit has no or almost no so-called dimple (depression of the copper surface at the point of the BMV). Hence, the copper surface of a sufficiently filled BMV is as even as possible.

An insufficient BMV filling is characterised by a concave structure of the copper deposit, i.e. by a dimple. Voids in a copper filled via are also insufficient.

Methods (Examples 1 to 6)

Equipment: Garnell cell with 1.8 l volume, bath agitation with a pump, no air injection, soluble copper anodes.

A copper bath stock solution comprising 45 g/l $Cu^{2+}$ ions (added as copper sulfate), 150 g/l sulfuric acid, 50 mg/l $Cl^-$ ions, 100 mg/l $Fe^{2+}$ ions, 300 mg/l polyethylenglycol as a carrier-suppressor additive and 0.5 mg/l bis-(sodiumsulfopropyl)-disulfide (SPS) as an accelerator-brightener additive was used. The leveller additives were added to said stock solution.

Parameters for copper plating: 2 A cell current, 67 min plating time, approx. 18-20 µm copper layer thickness in areas of the test boards used for further investigation, 90 min dummy substrate plating at 2 A prior to all experiments.

The test board layout used throughout examples 1 to 6 comprises blind micro via and trench structures with dimensions of for example 100×80 µm, 120×80 µm, 150×80 µm, 150×60 µm.

Example 1 (Comparative)

3-amino-5-mercapto-1,2,4-triazole in a concentration of 0.3 mg/l was added to the aqueous acidic plating bath as the leveller additive. A cross-section of a BMV after copper plating was investigated with an optical microscope. The BMV-filling properties of said leveller additive are not sufficient (FIG. 1).

Example 2 (Comparative)

5-phenyl-1H-1,2,4-triazole-3-thiol (EP 1 069 211 A2) in a concentration of 0.3 mg/l was added as the leveller additive. A cross-section of a BMV after copper plating was investigated with an optical microscope. The BMV-filling properties of said leveller additive are insufficient.

Example 3 (Comparative)

4-amino-5-(4'-pyridyl)-4H-1,2,4-triazole-3-thiol (EP 1 069 211 A2) in a concentration of 0.3 mg/l was added as the leveller additive. A cross-section of a BMV after copper plating was investigated with an optical microscope. The BMV-filling properties of said leveller additive are insufficient.

Example 4 (Present Invention)

Figure 2:
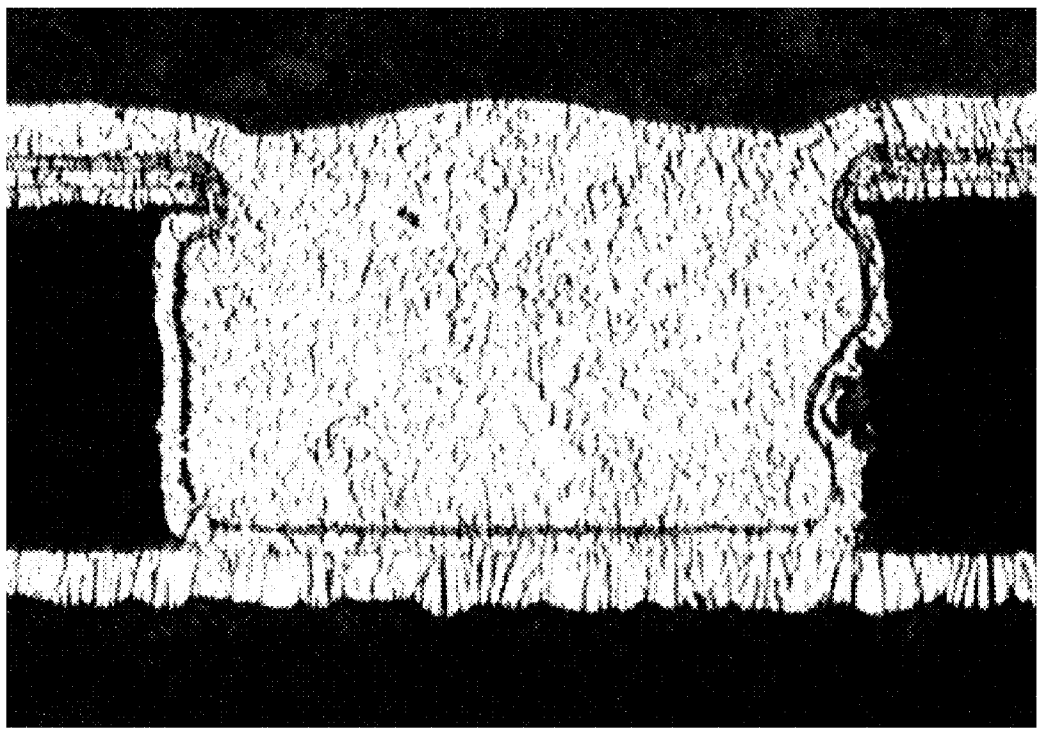
FIG. 2 shows an optical micrograph of a filled BMV obtained from Example 2 (present invention).

1-[2-(dimethylamino)ethyl]-1H-tetrazole-5-thiol in a concentration of 0.3 mg/l was added to the plating bath as the leveller additive. A cross-section of a BMV after copper plating was investigated with an optical microscope. The BMV-filling properties of said leveller additive are sufficient (FIG. 2).

Example 5 (Present Invention)

1-[2-(dimethylamino)ethyl]-triazole-5-thiol in a concentration of 0.3 mg/l was added to the plating bath as the leveller additive. A cross-section of a BMV after copper plating was investigated with an optical microscope. The BMV-filling properties of said leveller additive are sufficient.

Example 6 (Comparative)

1-[2-(dimethylamino)ethyl]-diazole-5-thiol in a concentration of 0.3 mg/l was added to the plating bath as the leveller additive. A cross-section of a BMV after copper plating was investigated with an optical microscope. The BMV-filling properties of said leveller additive are sufficient.

Methods and Process Flow (Examples 7 to 10)

The silicon substrates having TSV structures with dimensions of 20×100 µm were first immersed in DI water, then immersed in aqueous pre-treatment compositions according to examples 7 to 10 for 10 min, rinsed with DI water and then subjected to electrolytic copper plating.

A copper plating bath comprising copper sulfate, sulfuric acid, an accelerator-brightener additive, a leveller additive which is not a molecule according to formula (I), a carrier-suppressor additive and chloride ions was used for electrolytic copper plating in step (iii). The plating parameters were 120 min at 0.1 $A/dm^2$ followed by 60 min at 0.2 $A/dm^2$.

Plating equipment: Nexx plating tool

Example 7 (Comparative)

Figure 3:
FIG. 3 shows an optical micrograph of a copper filled TSV obtained from Example 7 (comparative).

The silicon substrate was immersed in an aqueous pre-treatment composition consisting of 4 mg/l bis-(ω-sulfopropyl)-disulfide as accelerator-brightener additive and no leveller additive for 10 min prior to copper plating. The micrograph of a cross-sectioned TSV after copper plating shows large voids (FIG. 3).

Example 8 (Comparative)

Figure 4:
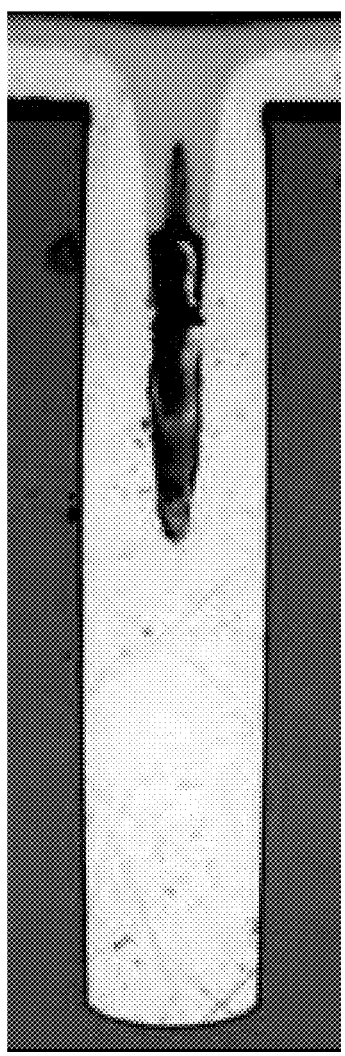
FIG. 4 shows an optical micrograph of a copper filled TSV obtained from Example 8 (comparative).

The silicon substrate was immersed in an aqueous pre-treatment composition consisting of 50 mg/l of a leveller additive which is not a molecule according to formula (I) and 4 mg/l bis-(ω-sulfopropyl)-disulfide as accelerator-brightener additive for 10 min, rinsed with water and then subjected to copper plating. The micrograph of a cross-sectioned TSV after copper plating shows a dimple. Hence, the via filling is insufficient (FIG. 4).

Example 9 (Present Invention)

Figure 5:
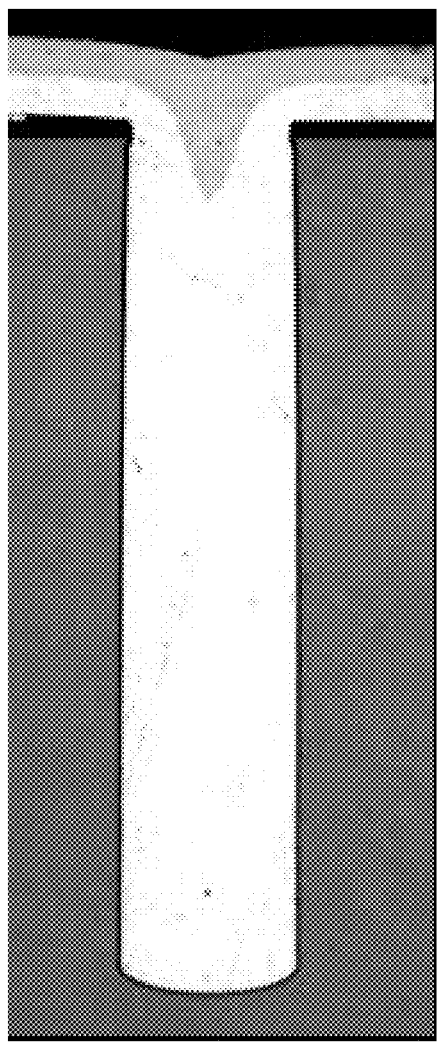
FIG. 5 shows an optical micrograph of a copper filled TSV obtained from Example 9 (present invention).

The silicon substrate was immersed in a pre-treatment composition comprising 50 mg/l 1-[2-(dimethylamino)ethyl]-1H-tetrazole-5-thiol as leveller additive according to formula (I) and 4 mg/l of bis-(ω-sulfopropyl)-disulfide as accelerator-brightener additive for 10 min, rinsed with water and then subjected to copper plating. The micrograph of a cross-sectioned TSV after copper plating is free of voids and the via filling is sufficient (FIG. 5).

Example 10 (Comparative)

Figure 6:
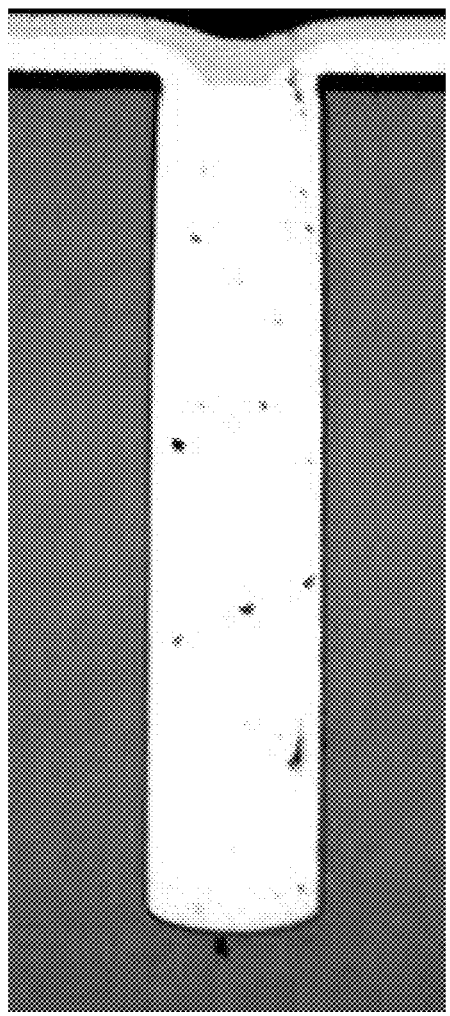
FIG. 6 shows an optical micrograph of a copper filled TSV obtained from Example 10 (comparative).

The silicon substrate was immersed in an aqueous pre-treatment composition consisting of 50 mg/l 1-[2-(dimethylamino)ethyl]-diazole-5-thiol as leveller additive and 4 mg/l of bis-(ω-sulfopropyl)-disulfide as accelerator-brightener additive for 10 min, rinsed with water and then subjected to copper plating. The micrograph of a cross-sectioned TSV after copper plating is free of voids and the via filling is sufficient (FIG. 6).

Example 11 (Present Invention)

Figure 7:
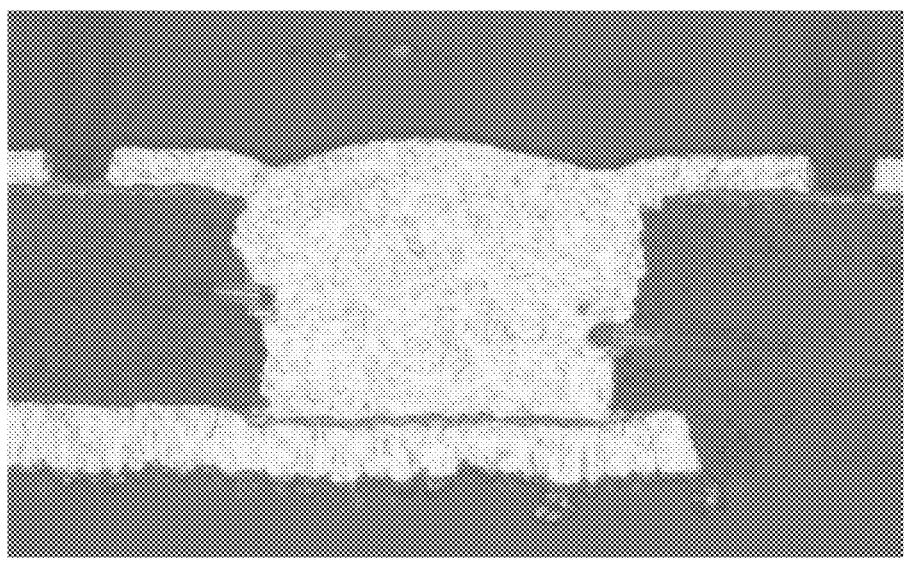
FIG. 7 shows an optical micrograph of a copper filled BMV obtained from Example 11 (present invention).

A substrate comprising blind micro vias (diameter: 85 μm, depth: 50 μm) coated with a layer of electroless copper were immersed in an aqueous pre-treatment composition consisting of 50 mg/l 1-[2-(dimethylamino)ethyl]-tetrazole-5-thiol as leveller additive, 4 mg/l of bis-(ω-sulfopropyl)-disulfide as accelerator-brightener additive and sulfuric acid for 10 min, rinsed with water and then subjected to copper plating using the same copper plating bath composition as described for Examples 7 to 10. The applied current density was 1.0 A/dm². The micrograph of a cross-sectioned BMV after copper plating is free of voids, shows a dimple of 3.4 μm and a copper layer thickness on top of the substrate surface of 7.1 μm (FIG. 7). Hence, the requirements for a sufficient BMV filling are achieved.

The invention claimed is:
1. Method for copper electroplating a substrate in an electroplating bath, wherein the electroplating bath comprises:
(i) at least one source of copper ions, and
(ii) at least one acid;
wherein the method comprises bringing the substrate into contact with a leveller additive, wherein: (i) the leveller additive is comprised in an aqueous pre-treatment composition prior to the copper electroplating, or (ii) the leveller additive is comprised in the electroplating bath during the copper electroplating or (iii) the leveller additive is comprised both in the aqueous pre-treatment composition prior to the copper electroplating and in the electroplating bath during the copper electroplating, and
wherein the leveller additive is selected from molecules according to formula (I):

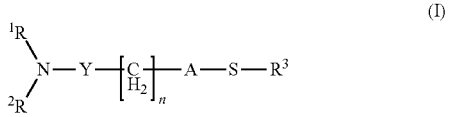

wherein Y is selected from the group consisting of —(NR⁴)—, —(CH₂)—, —O— and —S—;
n ranges from 0 to 6;
$R^1$ and $R^2$ are independently selected from hydrogen and $C_1$ to $C_4$ alkyl, linear and branched,
$R^3$ is selected from hydrogen, $C_1$ to $C_4$ alkyl, linear and branched, lithium, sodium, potassium and ammonium;
A is an unsubstituted triazole and
$R^4$ is selected from the group consisting of hydrogen and $C_1$ to $C_4$ alkyl, linear and branched, and
wherein the method further comprises bringing the substrate into contact with the electroplating bath and applying an electrical current to the substrate in the electroplating bath.
2. Method for copper electroplating according to claim 1 wherein the leveller additive is comprised in the electroplating bath.

3. Method for copper electroplating according to claim 2 wherein the at least one acid is selected from sulfuric acid, fluoro boric acid, phosphoric acid and methane sulfonic acid.
4. Method for copper electroplating according to claim 2 wherein n ranges from 1 to 6 if Y is selected from —(NR⁴)—, —O— and —S—.
5. Method for copper electroplating according to claim 2 wherein Y is selected from the group consisting of —(CH₂)— and —(NR⁴)—.
6. Method for copper electroplating according to claim 2 wherein $R^4$ is selected from hydrogen, methyl and ethyl.
7. Method for copper electroplating according to claim 2 wherein n ranges from 1 to 3.
8. Method for copper electroplating according to claim 2, wherein the concentration of the leveller additive according to formula (I) in the electroplating bath ranges from 0.001 to 100 mg/l.
9. Method for copper electroplating according to claim 1 wherein the leveller additive is comprised in the aqueous pretreatment composition and
wherein the method further comprises bringing the substrate into contact with the aqueous pre-treatment composition which further comprises at least one acid.
10. Method for copper electroplating according to claim 9 wherein the at least one acid is selected from sulfuric acid, fluoro boric acid, phosphoric acid and methane sulfonic acid.
11. Method for copper electroplating according to claim 9 wherein n ranges from 1 to 6 if Y is selected from —(NR⁴)—, —O— and —S—.
12. Method for copper electroplating according to claim 9 wherein Y is selected from the group consisting of —(CH₂)— and —(NR⁴)—.
13. Method for copper electroplating according to claim 9 wherein $R^4$ is selected from hydrogen, methyl and ethyl.
14. Method for copper electroplating according to claim 9 wherein n ranges from 1 to 3.
15. Method for copper electroplating according to claim 9, wherein the concentration of the leveller additive according to formula (I) in the aqueous pretreatment composition ranges from 0.001 to 100 mg/l.
16. Method for copper electroplating according to claim 1 wherein n ranges from 1 to 6 if Y is selected from —(NR⁴)—, —O— and —S—.
17. Method for copper electroplating according to claim 1 wherein Y is selected from the group consisting of —(CH₂)— and —(NR⁴)—.
18. Method for copper electroplating according to claim 1 wherein $R^3$ is hydrogen.
19. Method for copper electroplating according to claim 1 wherein n ranges from 1 to 3.
20. Method for copper electroplating according to claim 1 wherein the leveller additive is comprised both in the aqueous pre-treatment composition prior to the copper electroplating and in the electroplating bath during the copper electroplating, and wherein the method further comprises the steps of:
(A1) bringing the substrate into contact with the aqueous pre-treatment composition which further comprises at least one acid;
(A2) bringing the substrate into contact with the electroplating bath.

* * * * *